(12) United States Patent
Tsai et al.

(10) Patent No.: US 12,519,087 B2
(45) Date of Patent: Jan. 6, 2026

(54) PACKAGE STRUCTURE WITH UNDERFILL

(71) Applicant: Taiwan Semiconductor Manufacturing Company, Ltd., Hsinchu (TW)

(72) Inventors: Chen-Hsuan Tsai, Taitung (TW); Tsung-Fu Tsai, Changhua (TW); Shih-Ting Lin, Taipei (TW); Szu-Wei Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 10 days.

(21) Appl. No.: 18/484,571

(22) Filed: Oct. 11, 2023

(65) Prior Publication Data

US 2024/0055410 A1    Feb. 15, 2024

Related U.S. Application Data (63) Continuation of application No. 17/234,196, filed on Apr. 19, 2021, now Pat. No. 11,817,425, which is a continuation of application No. 16/383,929, filed on Apr. 15, 2019, now Pat. No. 10,985,140.

(51) Int. Cl.
| | | |
|---|---|---|
| H01L 25/065 | (2023.01) | |
| H01L 23/00 | (2006.01) | |
| H01L 23/48 | (2006.01) | |
| H01L 25/00 | (2006.01) | |

(52) U.S. Cl.
CPC ........ *H01L 25/0657* (2013.01); *H01L 23/481* (2013.01); *H01L 24/11* (2013.01); *H01L 25/50* (2013.01); *H01L 2224/0401* (2013.01)

(58) Field of Classification Search
CPC ... H01L 25/0657; H01L 25/50; H01L 23/481; H01L 24/11; H10B 80/00
See application file for complete search history.

(56) References Cited

U.S. PATENT DOCUMENTS

| | | |
|---|---|---|
| 8,604,615 B2 | 12/2013 | Lee |
| 9,721,930 B2 * | 8/2017 | Lee .................... H01L 25/50 |
| 9,793,187 B2 | 10/2017 | Lin et al. |

(Continued)

FOREIGN PATENT DOCUMENTS

| | | |
|---|---|---|
| CN | 104217997 A | 12/2014 |
| CN | 106489201 A | 3/2017 |

(Continued)

OTHER PUBLICATIONS

Chinese language office action dated Jul. 7, 2020, issued in application No. TW 109105261.

(Continued)

*Primary Examiner* — Jasmine J Clark
(74) *Attorney, Agent, or Firm* — McClure, Qualey & Rodack, LLP (57) ABSTRACT

A package structure is provided. The package structure includes a substrate and a semiconductor chip over the substrate. The package structure also includes a protective film laterally surrounding the semiconductor chip. The package structure further includes an underfill element between the semiconductor chip and the protective film. A portion of the underfill element is directly below the protective film.

20 Claims, 10 Drawing Sheets

(56) References Cited

U.S. PATENT DOCUMENTS

| | | |
|---|---|---|
| 9,847,298 B2 | 12/2017 | Kawase et al. |
| 10,008,395 B2 | 6/2018 | Hembree et al. |
| 10,943,888 B2 | 3/2021 | Chandolu |
| 10,985,140 B2 | 4/2021 | Tsai |
| 2015/0348954 A1 | 12/2015 | Chandolu |
| 2016/0307815 A1 | 10/2016 | Huang et al. |
| 2016/0351419 A1 | 12/2016 | Lin et al. |
| 2018/0108592 A1 | 4/2018 | Hembree |
| 2018/0286835 A1 | 10/2018 | Nah |
| 2019/0067148 A1* | 2/2019 | Wu .................. H01L 23/49827 |
| 2020/0219853 A1 | 7/2020 | Hwang et al. |

FOREIGN PATENT DOCUMENTS

| | | |
|---|---|---|
| CN | 107104081 A | 8/2017 |
| TW | 201250972 A | 12/2012 |
| WO | 2019/007513 A1 | 1/2019 |

OTHER PUBLICATIONS

Chinese language office action dated Nov. 2, 2021, issued in application No. CN 202010082221.3.

* cited by examiner

PACKAGE STRUCTURE WITH UNDERFILL

PRIORITY CLAIM AND CROSS-REFERENCE

This Application is a Continuation application of U.S. application Ser. No. 17/234,196, filed on Apr. 19, 2021, now U.S. Pat. No. 11,817,425, which is a Continuation application of U.S. application Ser. No. 16/383,929, filed on Apr. 15, 2019, now U.S. Pat. No. 10,985,140, the entirety of which are incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1D are perspective views of various stages of a process for forming a package structure, in accordance with some embodiments. FIGS. 2A-2E are cross-sectional views of various stages of a process for forming a package structure, in accordance with some embodiments. In some embodiments, FIG. 2A is a cross-sectional view taken along the line 2-2 in FIG. 1A.

Figure 1A:
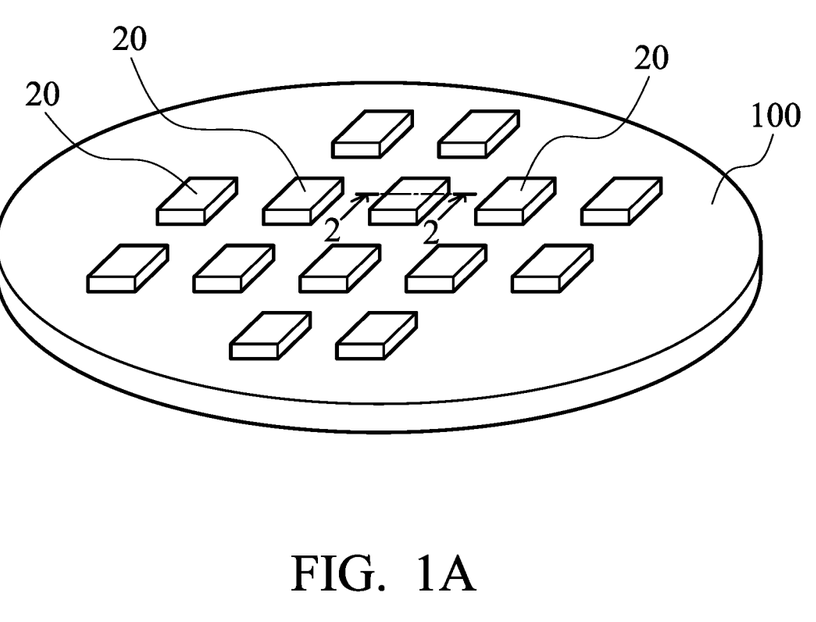
FIGS. 1A-1D are perspective views of various stages of a process for forming a package structure, in accordance with some embodiments.
Figure 2A:
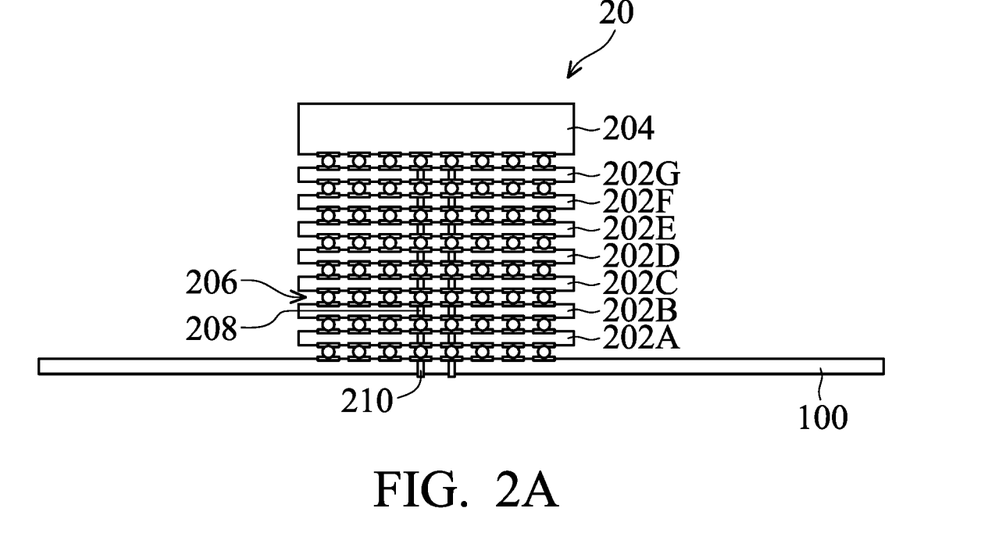
FIGS. 2A-2E are cross-sectional views of various stages of a process for forming a package structure, in accordance with some embodiments.

As shown in FIGS. 1A and 2A, a substrate 100 is received or provided, in accordance with some embodiments. The substrate 100 may be made of or include a semiconductor material, a ceramic material, one or more other suitable materials, or a combination thereof. In some embodiments, the substrate 100 is a semiconductor wafer such as a silicon wafer. In some other embodiments, the substrate 100 is a glass wafer. In some other embodiments, the substrate 100 is a polymer-containing substrate with a profile similar to a silicon wafer.

As shown in FIG. 1A, multiple semiconductor die structures 20 are disposed over the substrate 100, in accordance with some embodiments. As shown in FIG. 2A, one of the semiconductor die structures 20 is bonded onto the substrate 100, in accordance with some embodiments. In some embodiments, each of the semiconductor die structures 20 includes a stack of multiple semiconductor dies 202A-202G. The stack of multiple semiconductor dies may include four to twelve (or more) semiconductor dies. In some embodiments, the semiconductor dies 202A-202G are used to provide the same or similar functions. In some embodiments, the semiconductor dies 202A-202G are memory dies. In some embodiments, each of the semiconductor die structures 20 further includes a semiconductor die 204. The semiconductor die 204 may be used to transmit electrical signals into and/or from the stack of the semiconductor dies 202A-202G.

As shown in FIG. 2A, bonding structures 206 are formed between the semiconductor dies 202A-202G and 204, in accordance with some embodiments. The semiconductor die structure 20 may also be bonded onto the substrate 100 using some of the bonding structures 206, as shown in FIG. 2A. In some embodiments, the bonding structures 206 include conductive pillars and solder elements.

In some embodiments, through substrate vias (TSVs) 208 are formed in the semiconductor dies 202A-202G, as shown in FIG. 2A. The TSVs 208 may be used to form electrical connections between the stacked semiconductor dies 202A-202G and 204. In some embodiments, other through substrate vias (TSVs) 210 are formed in the substrate 100.

In some embodiments, the semiconductor dies 202A-202G are stacked together through the bonding structures 206 one by one at a first position of the substrate 100, as shown in FIG. 2A. Afterwards, other semiconductor dies 202A-202G are stacked together through the bonding structures 206 one by one again at a second position, as shown in FIG. 2A. The stacking process is repeatedly carried out to bond the semiconductor die structures 20 onto the substrate 100, as shown in FIG. 1A.

In some embodiments, the semiconductor die structures 20 further include the semiconductor dies 204. The stacking of the semiconductor dies 204 may be carried out after all the other semiconductor dies 202A-202G of different semiconductor die structures 20 are stacked. In some embodiments, a thermal reflow process is performed to the solder elements of the bonding structures 206. As a result, the bonding strength of the bonding structures 206 is enhanced.

Figure 1B:
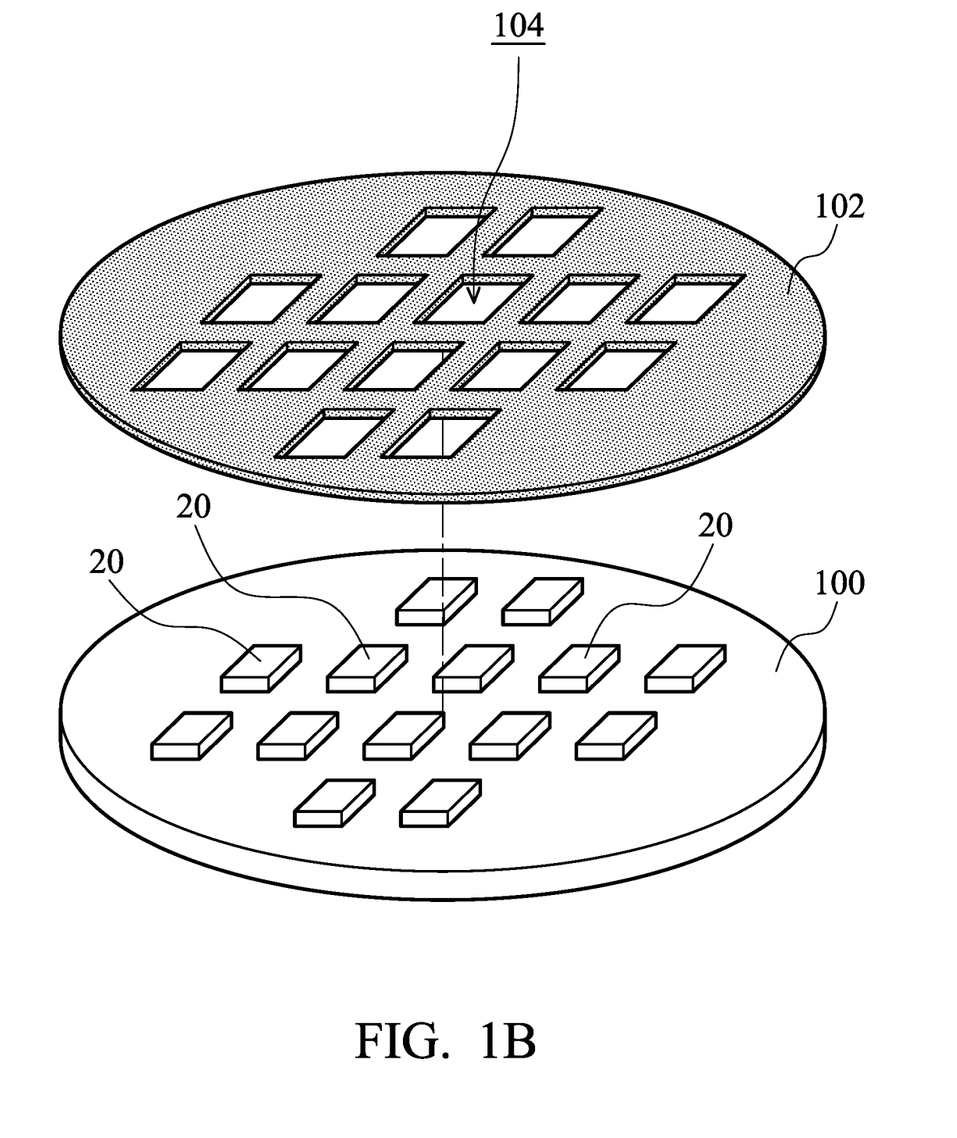

As shown in FIG. 1B, a protective film 102 is provided and ready to be laminated onto the substrate 100, in accordance with some embodiments. In some embodiments, the protective film 102 is an insulating film. The protective film 102 may be made of or include an epoxy-based resin. In some embodiments, the protective film 102 includes fillers that are dispersed in the epoxy-based resin. The fillers may include fibers (such as silica fibers), particles (such as silica particles), or a combination thereof. In some embodiments, the lower surface of the protective film 102 facing the substrate 100 is adhesive. Therefore, the protective film 102 may be attached onto the substrate 100 like an adhesive tape in a subsequent lamination process.

As shown in FIG. 1B, multiple openings 104 are formed in the protective film 102, in accordance with some embodiments. The openings 104 may completely penetrate through the protective film 102. Each of the openings 104 has a size that is large enough to expose an entirety of the corresponding semiconductor die structure 20 if the protective film 102 is laminated onto the substrate 100 later. In some embodiments, each of the openings 104 has a profile similar to that of the semiconductor die structure 20.

The openings 104 may be formed using an energy beam drilling process, a mechanical drilling process, a photolithography process, one or more other applicable processes, or a combination thereof. For example, the energy beam used in the energy beam drilling process includes a laser beam, an electron beam, an ion beam, a plasma beam, one or more other suitable beams, or a combination thereof.

Figure 1C:
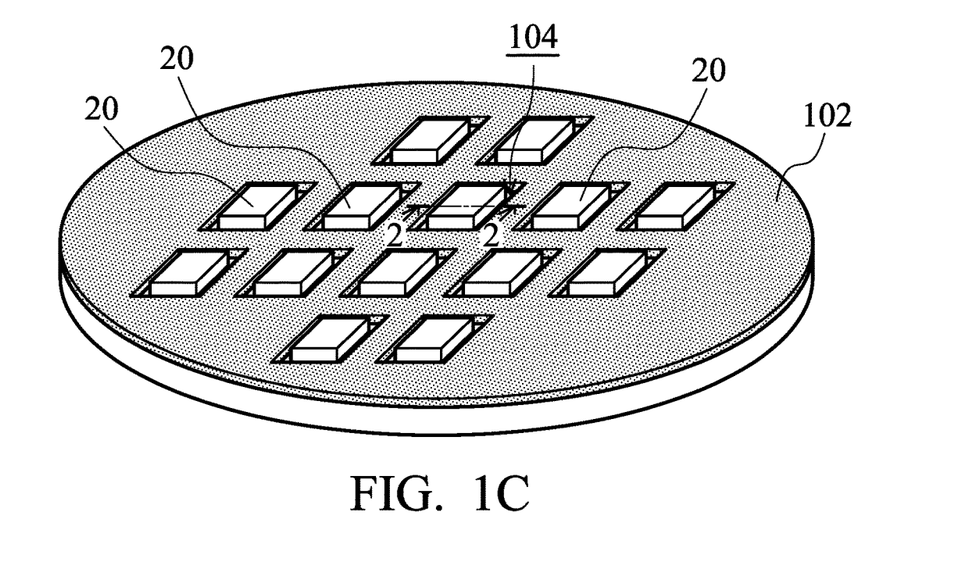
Figure 2B:
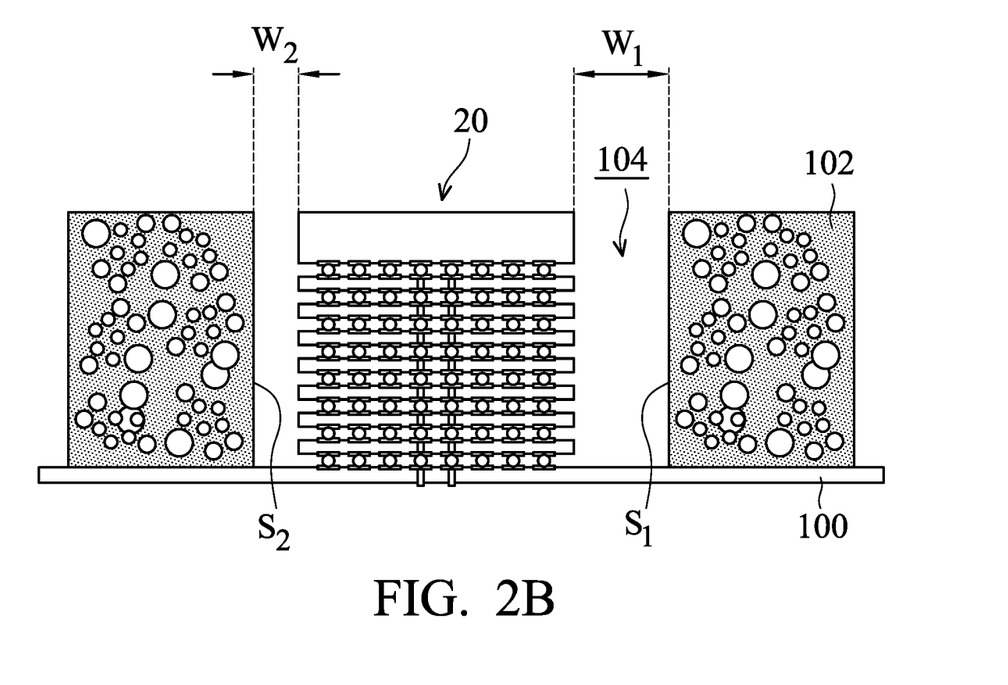

As shown in FIGS. 1C and 2B, the protective film 102 is disposed onto the substrate 100, in accordance with some embodiments. After the protective film 102 is disposed, the openings 104 of the protective film 102 expose the semiconductor die structures 20. In some embodiments, sidewalls of the openings 104 surround the semiconductor die structures 20, as shown in FIGS. 1C and 2B. In some embodiments, the sidewalls of the openings 104 are substantially vertical sidewalls, as shown in FIG. 2B.

Portions of the substrate 100 may also be exposed by the openings 104 since the openings 104 are wider than the semiconductor die structures 20, as shown in FIGS. 1C and 2B. One or more rollers may be used to assist in the attachment of the protective film 102.

Figure 3:
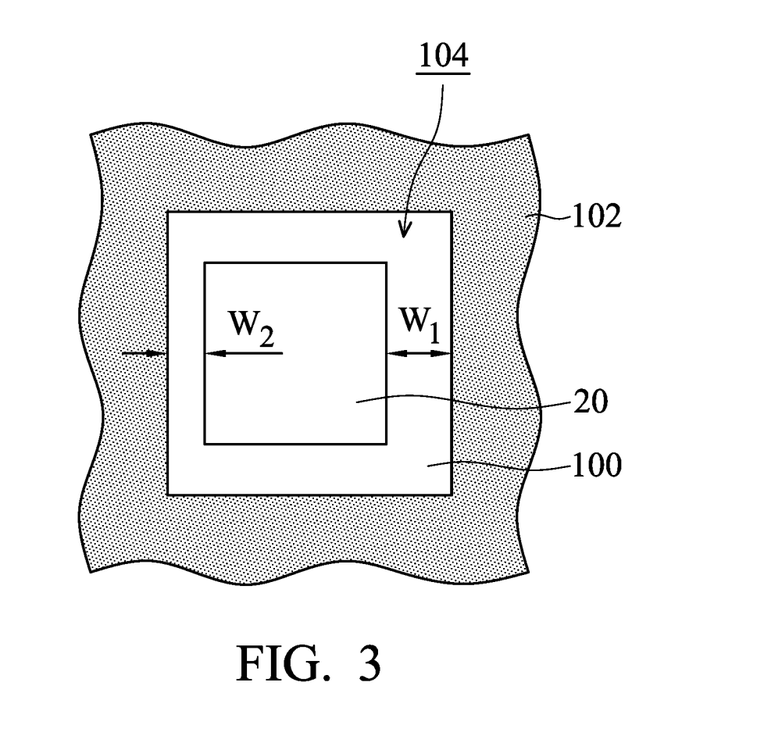
FIG. 3 is a top view of an intermediate stage of a process for forming a package structure, in accordance with some embodiments.

FIG. 3 is a top view of an intermediate stage of a process for forming a package structure, in accordance with some embodiments. In some embodiments, FIG. 3 is a top view of a portion of the structure shown in FIG. 2B. In some embodiments, sidewalls of the opening 104 continuously surround the semiconductor die structure 20.

As shown in FIGS. 2B and 3, the semiconductor die structure 20 is separated from a first sidewall $S_1$ of the opening 104 by a first distance $W_1$. The semiconductor die structure 20 is separated from a second sidewall $S_2$ of the opening 104 by a second distance $W_2$. The first sidewall $S_1$ and the second sidewall $S_2$ may be opposite sidewalls of the opening 104, as shown in FIG. 2B. In some embodiments, the first distance $W_1$ is longer than the second distance $W_2$. The first distance $W_1$ may be in a range from about 200 μm to about 400 μm. The second distance $W_2$ may be in a range from about 50 μm to about 250 μm.

However, embodiments of the disclosure are not limited thereto. Many variations and/or modifications can be made to embodiments of the disclosure. In some other embodiments, the first distance $W_1$ is substantially equal to the second distance $W_2$.

Figure 2C:
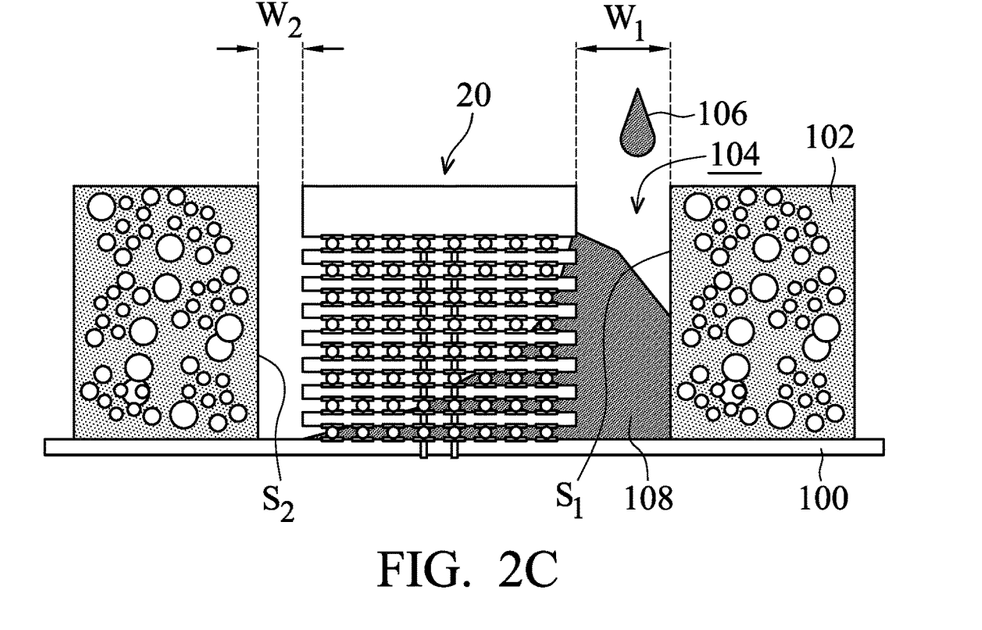

As shown in FIG. 2C, an underfill material 108 is dispensed or introduced into the opening 104, in accordance with some embodiments. In some embodiments, the underfill material 108 is a polymer-containing liquid with flowability. The underfill material 108 is in a liquid state while being dispensed into the opening 104. In some embodiments, droplets of polymer-containing liquids 106 are dispensed into the opening 104 to provide a suitable amount of the underfill material 108.

The underfill material 108 may be made of or include an epoxy-based resin. In some embodiments, the underfill material 108 includes fillers that are dispersed in the epoxy-based resin. The fillers may include fibers (such as silica fibers), particles (such as silica particles), or a combination thereof.

As shown in FIG. 2C, the underfill material 108 is dispensed onto a position that is closer to the first sidewall $S_1$ than the second sidewall $S_2$ of the opening 104, in accordance with some embodiments. As shown in FIG. 2C, the droplets of polymer-containing liquids 106 are closer to the first sidewall $S_1$ than the second sidewall $S_2$ of the opening 104.

As mentioned above, in some embodiments, the first distance $W_1$ is longer than the second distance $W_2$. The first distance $W_1$ may be in a range from about 200 µm to about 400 µm. The second distance $W_2$ may be in a range from about 50 µm to about 250 µm. Because the first distance $W_1$ is longer than the second distance $W_2$, dispensing the underfill material 108 onto the position that is closer to the first sidewall $S_1$ is easier than dispensing the underfill material 108 onto the position closer to the second sidewall $S_2$.

In some cases, if the first distance $W_1$ is smaller than about 200 µm, it might be difficult to dispense the underfill material 108 (or the droplets of polymer-containing liquids 106) into the opening 104 due to small spacing. In some other cases, if the first distance $W_1$ is longer than about 400 µm, the underfill material 108 may occupy too large an area of the substrate 100. The throughput may be negatively affected.

In some cases, if the second distance $W_2$ is smaller than about 50 µm, the semiconductor die structure 20 may be too close to the second sidewall $S_2$. A high thermal stress might be generated during a subsequent thermal process since no sufficient amount of underfill material is between the semiconductor die structure 20 and the second sidewall $S_2$. In some other cases, if the second distance $W_2$ is longer than about 250 µm, the underfill material 108 may occupy too large an area of the substrate 100. The throughput may be negatively affected.

In some embodiments, a portion of the underfill material 108 flows into space between the semiconductor dies 202A-202G and 204, as shown in FIG. 2C. The underfill material 108 may be sucked into the space between the semiconductor dies 202A-202G and 204 due to the capillary phenomenon. In some embodiments, the underfill material 108 surrounds the bonding structures 206 between the semiconductor dies 202A-202G and 204. In some embodiments, the underfill material 108 is in direct contact with the bonding structures 206.

Figure 1D:
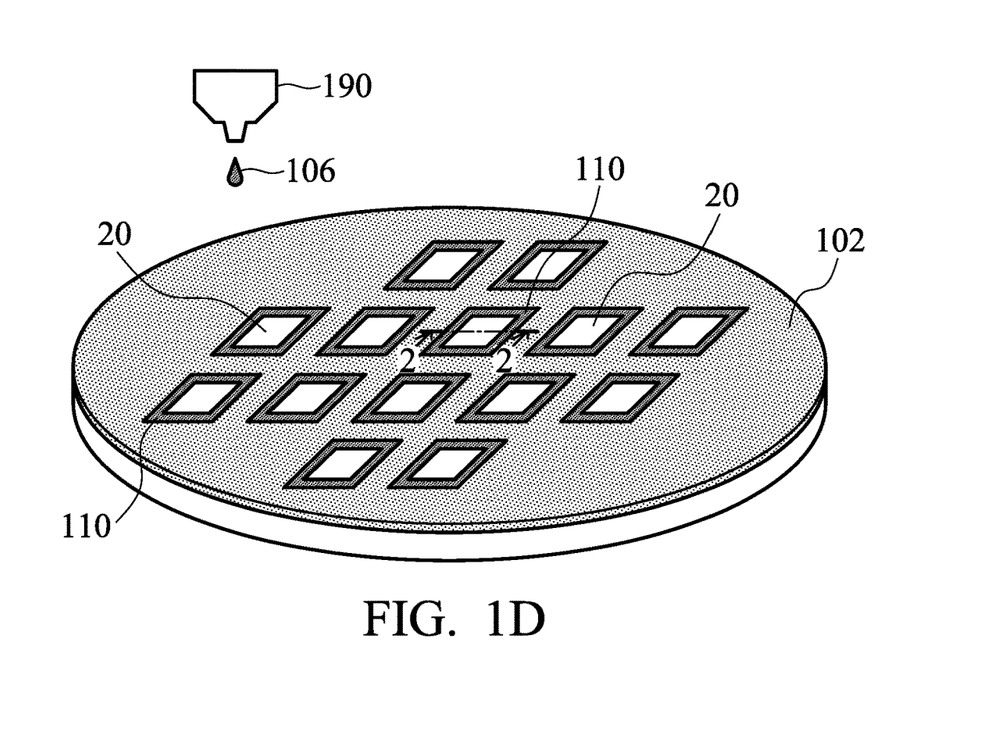
Figure 2D:
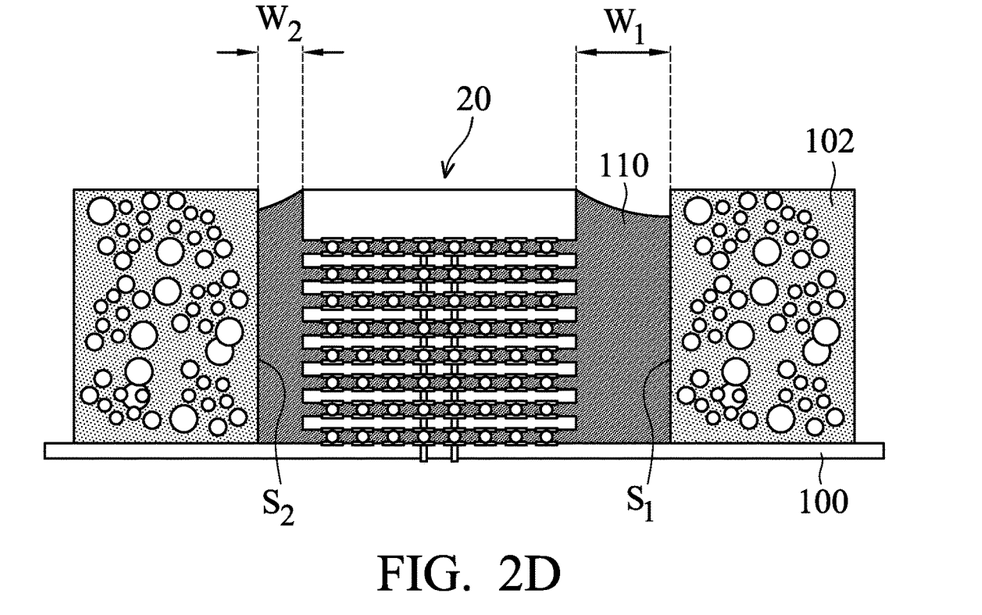

As shown in FIGS. 1D and 2D, the underfill material 108 substantially filling the openings 104 is then cured to form multiple underfill elements (or protective films or protective elements) 110 in the openings 104, in accordance with some embodiments. Due to the confinement of the protective film 102, the underfill elements 110 are formed at predetermined positions without occupying too much of the area of the substrate 100. The throughput may therefore be improved. As shown in FIG. 1D, the protective film 102 surrounds the underfill elements 110 and covering sidewall surfaces of the underfill elements 110, in accordance with some embodiments. In some embodiments, the protective film 102 encircles the underfill elements 110 and covering an entirety of sidewall surfaces of the underfill elements 110.

A thermal curing process may be carried out to cure the underfill material 108 to form the underfill elements 110, in accordance with some embodiments. The thermal curing process may be performed at a temperature that is in a range from about 100 degrees C. to about 250 degrees C. for about 30 minutes to about 12 hours. After the thermal curing process, the underfill material 108 may shrink and become the underfill elements 110.

Similar to the underfill material 108, the underfill elements 110 have a similar composition. The underfill elements 110 may be made of or include an epoxy-based resin. In some embodiments, the underfill elements 110 include fillers that are dispersed in the epoxy-based resin. The fillers may include fibers (such as silica fibers), particles (such as silica particles), or a combination thereof.

As mentioned above, in some embodiments, the protective film 102 is made of or includes an epoxy-based resin with fillers dispersed therein. The fillers may include fibers (such as silica fibers), particles (such as silica particles), or a combination thereof. In some embodiments, the protective film 102 has a greater weight percentage of fillers than the weight percentage of fillers of the underfill elements 110. In some embodiments, the fillers in the protective film 102 have a greater average size than the fillers in the underfill elements 110.

Due to the confinement of the protective film 102, the underfill elements 110 are separated from each other. Each of the underfill elements 110 has a predetermined area. Therefore, the thermal stress generated from forming the underfill elements 110 is reduced. The warpage of the substrate 100 after the thermal curing process is significantly reduced, which facilitates to subsequent packaging processes. A smaller amount of underfill material is used for forming the underfill elements 110. The time and cost of the process may be reduced.

In some other cases where the protective film 102 is not formed to confine the underfill material 108, a greater amount of underfill material may be dispensed in order to reach a high enough level to cover the bonding structures 206 between the semiconductor dies 204 and 202G. As a result, the underfill material may extend over the entire surface of the substrate 100. Underfill material that extends over a large area may cause high thermal stress during the thermal curing process and lead to large degree of warpage of the substrate 100. The warpage of the substrate 100 may negatively affect the subsequent packaging processes. A greater amount of underfill material may also increase the cost of process and of the subsequent cleaning process.

Figure 2E:
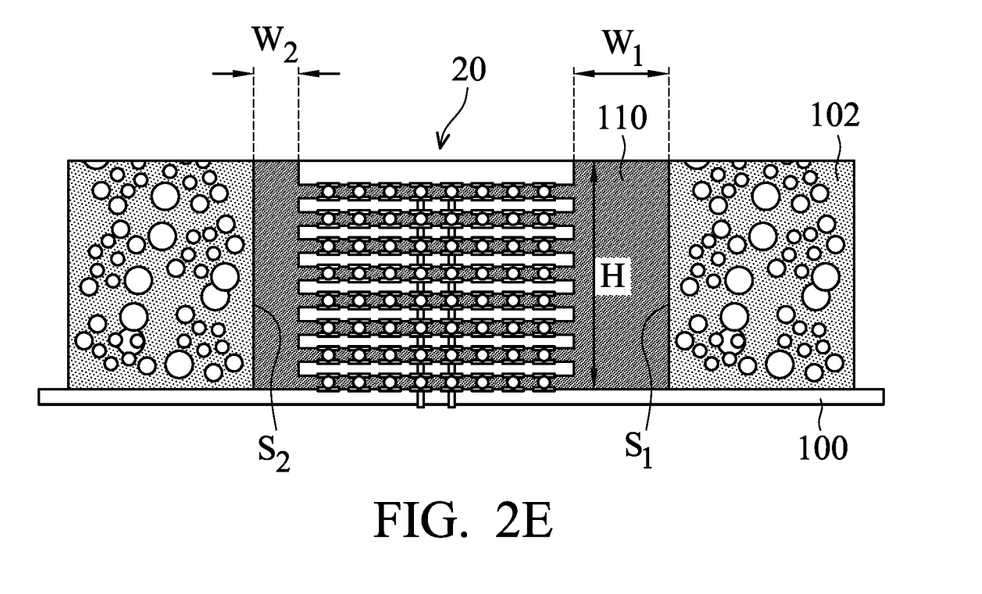

As shown in FIG. 2E, a planarization process is used to partially remove the protective film 102 and the underfill element 110, in accordance with some embodiments. Therefore, the top surface of the structure shown in FIG. 2E or FIG. 1D may be substantially coplanar, which facilitates to the subsequent packaging processes. In some embodiments, a portion of the semiconductor die 204 is also thinned during the planarization process. The planarization process may include a grinding process, a chemical mechanical polishing (CMP) process, a dry polishing process, an etching process, one or more other applicable processes, or a combination thereof.

In some embodiments, a dispenser 190 is used to dispense the underfill material for forming the underfill element 110, as shown in FIG. 1D. In some embodiments, the dispenser 190 is used to respectively dispense the polymer-containing liquid 106 into the openings 104 (as shown in FIG. 1C) one by one.

However, embodiments of the disclosure are not limited thereto. Many variations and/or modifications can be made to embodiments of the disclosure. In some other embodiments, two or more dispensers are used for dispensing the underfill material.

Figure 4:
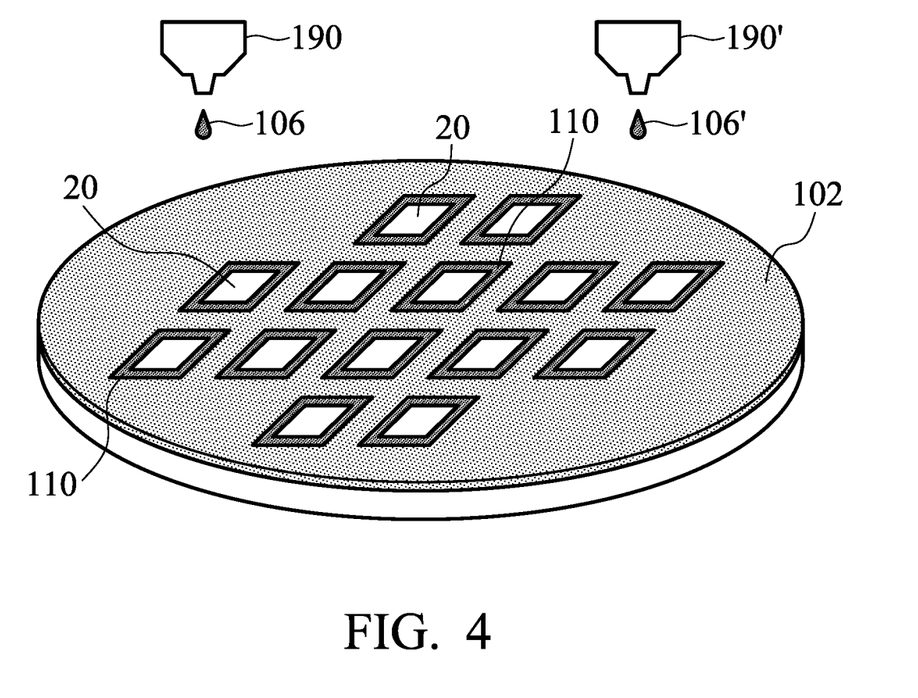
FIG. 4 is a perspective view of an intermediate stage of a process for forming a package structure, in accordance with some embodiments.

FIG. 4 is a perspective view of an intermediate stage of a process for forming a package structure, in accordance with some embodiments. As shown in FIG. 4, two dispensers 190 and 190' are used to dispense polymer-containing liquids 106 and 106' into the openings 104 (as shown in FIG. 1C). In some embodiments, the dispensers 190 and 190' are used to respectively dispense the polymer-containing liquids 106 and 106' into the openings 104 (as shown in FIG. 1C) one by one. In some embodiments, the dispensers 190 and 190' are not used to dispense the polymer-containing liquid into the same opening 104 at the same time. In some embodiments, the dispensers 190 and 190' are used to dispense the polymer-containing liquid into different openings 104, respectively.

In some embodiments, because the dispensers 190 and 190' do not dispense the polymer-containing liquid into the same opening 104, the flow direction of the polymer-containing liquid may be controlled in a suitable direction. Voids may be prevented from being formed in the space between the semiconductor dies 202A-202G and 204. In some other cases, if two dispensers are used to dispense the polymer-containing liquids into the same opening, the polymer-containing liquids may flow into the space between the semiconductor dies 202A-202G and 204 from different positions. As a result, a middle portion of the space may not be able to be filled with the polymer-containing liquids, which may lead to the formation of voids. The voids may negatively affect the reliability and performance of the package structure.

In some embodiments illustrated in FIGS. 1B-1D, each of the openings 104 of the protective film 102 has a rectangular top view profile. However, embodiments of the disclosure are not limited thereto. Many variations and/or modifications can be made to embodiments of the disclosure. In some other embodiments, the openings 104 have top view profiles other than rectangular profiles.

Figure 5A:
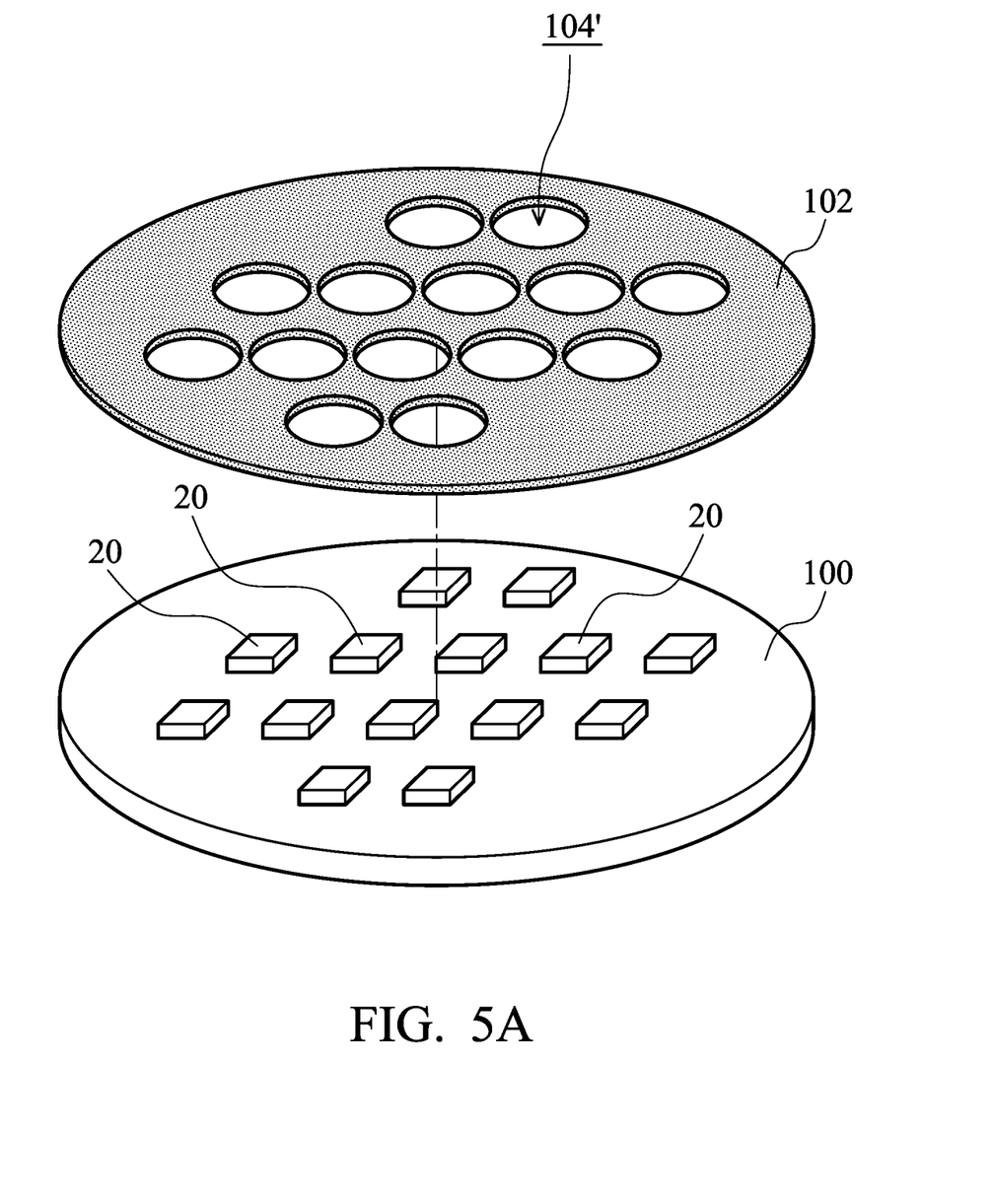
FIGS. 5A-5C are perspective views of various stages of a process for forming a package structure, in accordance with some embodiments.
Figure 5B:
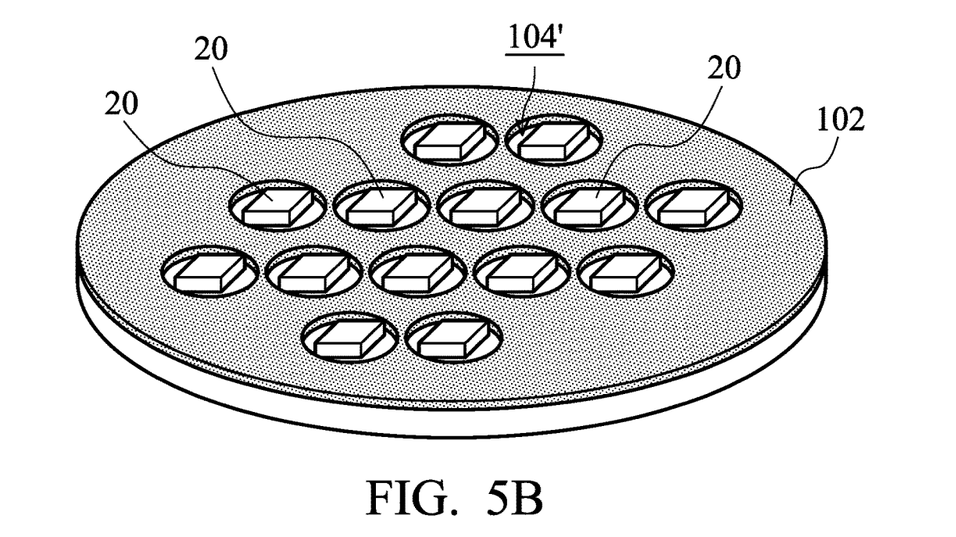
Figure 5C:
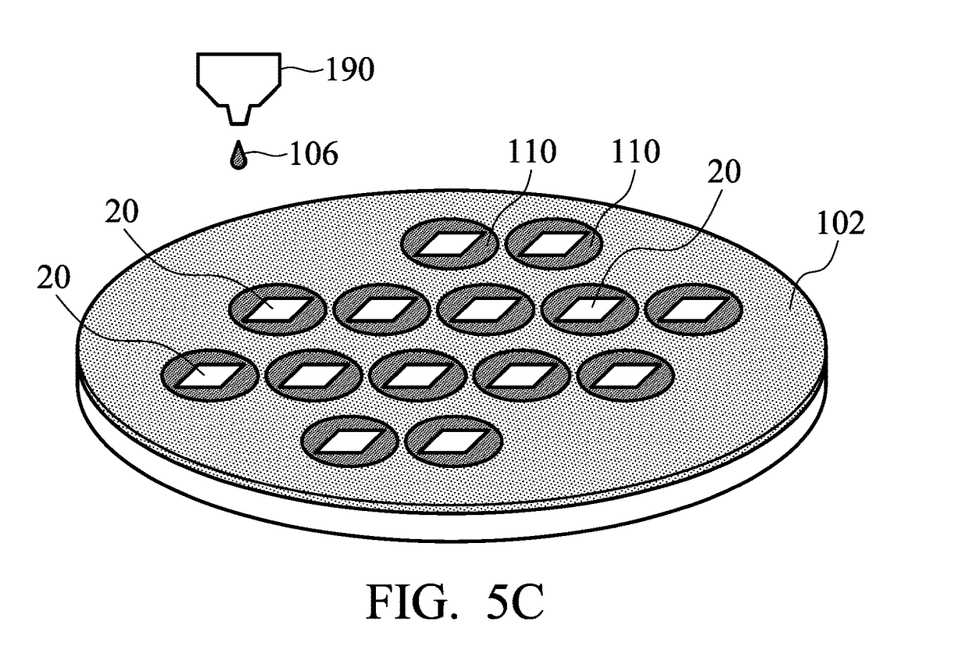

FIGS. 5A-5C are perspective views of various stages of a process for forming a package structure, in accordance with some embodiments. As shown in FIG. 5A, similar to the embodiments illustrated in FIG. 1B, the protective film 102 is provided and ready to be laminated onto the substrate 100, in accordance with some embodiments. As shown in FIG. 5A, multiple openings 104' are formed in the protective film 102, in accordance with some embodiments. The openings 104' may completely penetrate through the protective film 102. Each of the openings 104' has a size that is large enough to expose an entirety of the corresponding semiconductor die structure 20 if the protective film 102 is laminated onto the substrate 100 later. In some embodiments, each of the openings 104' has a circular or oval profile.

The openings 104' with the circular or oval profile may be formed using an energy beam drilling process, a mechanical drilling process, a photolithography process, one or more other applicable processes, or a combination thereof. For example, the energy beam used in the energy beam drilling process includes a laser beam, an electron beam, an ion beam, a plasma beam, one or more other suitable beams, or a combination thereof.

As shown in FIGS. 5B, the protective film 102 is disposed onto the substrate 100, in accordance with some embodiments. After the protective film 102 is disposed, the openings 104' of the protective film 102 expose the semiconductor die structures 20. In some embodiments, sidewalls of the openings 104' encircle the semiconductor die structures 20, as shown in FIG. 5B.

Portions of the substrate 100 may also be exposed by the openings 104' since the openings 104' are wider than the semiconductor die structures 20, as shown in FIG. 5B. One or more rollers may be used to assist in the attachment of the protective film 102.

As shown in FIG. 5C, similar to the embodiments illustrated in FIG. 1D or 4, one or more dispensers 190 are used to dispense the polymer-containing liquids into the openings 104'. In some embodiments, a thermal curing process is then used to cure the polymer-containing liquids into underfill elements 110. Due to the rounded profiles of the underfill elements 110, the stress may be reduced.

In some embodiments, the openings 104 or 104' of the protective film 102 have substantially vertical sidewalls. However, embodiments of the disclosure are not limited thereto. Many variations and/or modifications can be made to embodiments of the disclosure.

Figure 6:
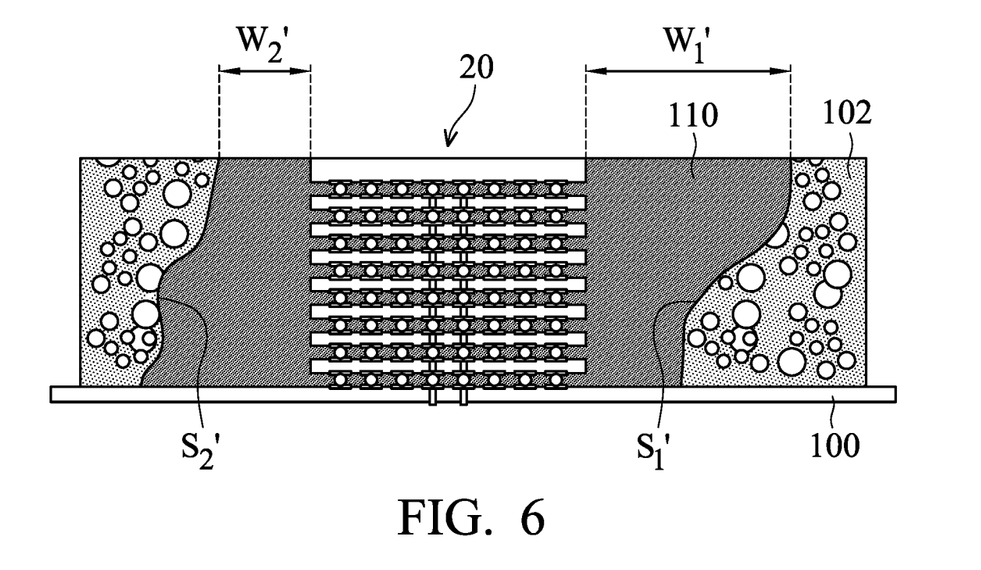
FIG. 6 is a cross-sectional view of a package structure, in accordance with some embodiments.

FIG. 6 is a cross-sectional view of a package structure, in accordance with some embodiments. In some embodiments, the protective film 102 has irregular sidewalls other than vertical sidewalls, as shown in FIG. 6. As shown in FIG. 6, the protective film 102 has a first sidewall $S_1'$ and a second sidewall $S_2'$. Different from the first sidewall $S_1$ and the second sidewall $S_2$ shown in FIG. 2E, the first sidewall $S_1'$ and the second sidewall $S_2'$ have irregular or non-planar profiles.

As shown in FIG. 6, the top of the semiconductor die structure 20 is laterally separated from the top of the first sidewall $S_1'$ of the protective film 102 by a first distance $W_1'$. The top of the semiconductor die structure 20 is separated from the top of the second sidewall $S_2'$ of the protective film 102 by a second distance $W_2'$. The first sidewall $S_1'$ and the second sidewall $S_2'$ may be opposite sidewalls of the protective film 102. In some embodiments, the first distance $W_1'$ is longer than the second distance $W_2'$. The first distance $W_1'$ may be in a range from about 200 μm to about 400 μm. The second distance $W_2$ may be in a range from about 50 μm to about 250 μm.

In some embodiments, the polymer-containing liquid used for forming the underfill element 110 is dispensed at a position that is closer to the first sidewall $S_1'$ than the second sidewall $S_2'$. Because the first sidewall $S_1'$ is separated from the semiconductor die structure 20 by a longer distance, the dispensing of the polymer-containing liquid would be easier. The quality and reliability of the underfill element 110 are improved.

In some embodiments, each of the semiconductor die structures 20 includes a stack of multiple semiconductor dies. However, embodiments of the disclosure are not limited thereto. Many variations and/or modifications can be made to embodiments of the disclosure. In some other embodiments, some or all of the semiconductor die structures 20 are not a stack of multiple semiconductor dies. Each of the semiconductor die structures 20 may include only one semiconductor die.

Embodiments of the disclosure form a package structure by attaching protective element with openings onto a substrate. Each of the openings surrounds or encircles a semiconductor die structure. An underfill material liquid is dispensed into the opening and is then cured to form an underfill element surrounding and protecting bonding structures of the semiconductor die structure. Due to the confinement of the protective film, the underfill element is formed at predetermined positions without occupying too much of the area. The cost and time of the process may be reduced. Warpage of the substrate caused by the curing process for forming the underfill element may also be significantly reduced since the underfill material liquid merely occupied a confined area. The performance and reliability of the package structure are improved.

In accordance with some embodiments, a method for forming a package structure is provided. The method includes disposing a semiconductor die structure over a substrate. The method also includes disposing a protective film over the substrate. The protective film has an opening exposing the semiconductor die structure, and sidewalls of the opening surround the semiconductor die structure. The method further includes dispensing an underfill material into the opening to surround the semiconductor die structure.

In accordance with some embodiments, a method for forming a package structure is provided. The method includes disposing a first semiconductor die structure and a second semiconductor die structure over a substrate. The method also includes disposing a protective film over the substrate. The protective film has two openings respectively exposing the first semiconductor die structure and the second semiconductor die structure. Sidewalls of the openings respectively surround the first semiconductor die structure and the second semiconductor die structure. The method further includes respectively dispensing a polymer-containing liquid into the openings to surround the first semiconductor die structure and the second semiconductor die structure. In addition, the method includes curing the polymer-containing liquid to form a first protective element and a second protective element respectively surrounding the first semiconductor die structure and the second semiconductor die structure.

In accordance with some embodiments, a package structure is provided. The package structure includes a substrate and a semiconductor die structure over the substrate. The package structure also includes an underfill element surrounding the semiconductor die structure. The package structure further includes a protective film surrounding the underfill element and covering sidewall surfaces of the underfill element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a substrate;
a semiconductor chip over the substrate;
a protective film laterally surrounding the semiconductor chip; and
an underfill element between the semiconductor chip and the protective film, wherein a portion of the underfill element is directly below the protective film, the protective film has a first weight percentage of fillers, the underfill element has a second weight percentage of fillers, and the first weight percentage of fillers is greater than the second weight percentage of fillers.

2. The package structure as claimed in claim 1, wherein the protective film comprises first fillers, the underfill element comprises second fillers, and the first fillers have a greater average size than that of the second fillers.

3. The package structure as claimed in claim 1, wherein the underfill element is in direct contact with the protective film.

4. The package structure as claimed in claim 1, wherein a top of the semiconductor chip is closer to the substrate than a top of the protective film.

5. The package structure as claimed in claim 1, wherein the protective film has a first interior sidewall and a second interior sidewall, and the first interior sidewall and the second interior sidewall are in direct contact with the underfill element.

6. The package structure as claimed in claim 5, wherein the semiconductor chip is closer to the second interior sidewall than the first interior sidewall.

7. The package structure as claimed in claim 1, wherein a portion of the underfill element is between the semiconductor chip and the substrate.

8. The package structure as claimed in claim 1, wherein a sidewall of the protective film has convex or concave surface curvature.

9. The package structure as claimed in claim 1, wherein the protective film has asymmetric opposite sidewalls, the asymmetric opposite sidewalls are non-planar, and the asymmetric opposite sidewalls have different profiles.

10. The package structure as claimed in claim 1, further comprising:
a second semiconductor chip over the semiconductor chip, wherein the underfill element surrounds the second semiconductor chip.

11. A package structure, comprising:
a substrate;
a semiconductor chip over the substrate;
an underfill element laterally surrounding the semiconductor chip; and
a protective film laterally surrounding the underfill element and the semiconductor chip, wherein a sidewall of the protective film has convex or concave surface curvature, the protective film has a first interior sidewall and a second interior sidewall, and the second interior sidewall is closer to the semiconductor chip than the first interior sidewall.

12. The package structure as claimed in claim 11, wherein the protective film has a first weight percentage of fillers, the underfill element has a second weight percentage of fillers, and the first weight percentage of fillers is greater than the second weight percentage of fillers.

13. The package structure as claimed in claim 11, wherein the protective film has asymmetric opposite sidewalls, the asymmetric opposite sidewalls are non-planar, and the asymmetric opposite sidewalls have different profiles.

14. The package structure as claimed in claim 11, wherein a portion of the underfill element is directly under the protective film.

15. The package structure as claimed in claim 11, wherein the protective film comprises first fillers, the underfill element comprises second fillers, and the first fillers have a greater average size than that of the second fillers.

16. A package structure, comprising:
a substrate;

a semiconductor chip over the substrate;
a protective film laterally surrounding the semiconductor chip; and
an underfill element between the semiconductor chip and the protective film, wherein the protective film has asymmetric opposite sidewalls, the asymmetric opposite sidewalls are non-planar, and the asymmetric opposite sidewalls have different profiles.

17. The package structure as claimed in claim 16, wherein a top of the semiconductor chip is closer to the substrate than a top of the protective film.

18. The package structure as claimed in claim 16, wherein the protective film is in direct contact with the underfill element.

19. The package structure as claimed in claim 16, wherein the protective film comprises first fillers, the underfill element comprises second fillers, and the first fillers have a greater average size than that of the second fillers.

20. The package structure as claimed in claim 16, wherein a portion of the underfill element extends under the protective film.

* * * * *